(12) United States Patent
Gadre (10) Patent No.: US 11,417,553 B2
(45) Date of Patent: *Aug. 16, 2022

(54) SUBSTRATE DEFORMATION DETECTION AND CORRECTION

(71) Applicant: Applied Materials, Inc., Santa Clara, CA (US)

(72) Inventor: Milind Gadre, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/942,469

(22) Filed: Jul. 29, 2020

(65) Prior Publication Data

US 2020/0357672 A1 Nov. 12, 2020

Related U.S. Application Data

(63) Continuation of application No. 16/377,010, filed on Apr. 5, 2019, now Pat. No. 10,804,125.

(Continued)

(51) Int. Cl.
*H01L 21/67* (2006.01)
*H01J 37/32* (2006.01)

(52) U.S. Cl.
CPC .... *H01L 21/67288* (2013.01); *H01J 37/3299* (2013.01); *H01J 37/32183* (2013.01);
(Continued)

(58) Field of Classification Search
CPC ......... H01L 21/67288; H01L 21/67253; H01L 22/20; H01L 22/10; H01L 22/30; H01L 21/67276; H01J 37/32183; H01J 37/32926; H01J 37/3299; H01J 2237/3321; H01J 2237/334; H01J 2237/335
See application file for complete search history.

(56) References Cited

U.S. PATENT DOCUMENTS

2002/0138210 A1 9/2002 Wilkes et al.
2011/0293854 A1* 12/2011 Takizawa ............... H01L 22/12
427/569

(Continued)

FOREIGN PATENT DOCUMENTS

JP H03228347 A 10/1991
JP H09129528 A 5/1997

OTHER PUBLICATIONS

PCT/US2019/026155, International Search Report and Written Opinion dated Jul. 24, 2019, 13 pages.

(Continued)

*Primary Examiner* — Ziaul Karim
(74) *Attorney, Agent, or Firm* — Patterson + Sheridan, LLP (57) ABSTRACT

A method and apparatus for detecting and correcting incoming substrate deformation is disclosed. Substrates are positioned in a first process chamber, where the presence and type of substrate bow is detected. Based upon the detection of substrate bow, and a determination of whether the substrate has a compressive bow or a tensile bow, a substrate processing program is selected for execution. The substrate processing program can be executed in the first process chamber or in a second process chamber to correct or alleviate the bow prior to or during further processing of the substrate.

20 Claims, 6 Drawing Sheets

Related U.S. Application Data (60) Provisional application No. 62/668,175, filed on May 7, 2018.

(52) U.S. Cl.
CPC .. *H01J 37/32926* (2013.01); *H01L 21/67253* (2013.01); *H01J 2237/334* (2013.01); *H01J 2237/335* (2013.01); *H01J 2237/3321* (2013.01)

(56) References Cited

U.S. PATENT DOCUMENTS

| | | | |
|---|---|---|---|
| 2013/0052756 A1 | 2/2013 | Okujo et al. | |
| 2015/0361489 A1* | 12/2015 | Soper | B01L 3/502761 506/4 |
| 2016/0023183 A1* | 1/2016 | Levin | A61D 7/00 422/186.04 |
| 2016/0329206 A1* | 11/2016 | Kumar | H01L 21/0228 |
| 2018/0107854 A1 | 4/2018 | Tsai et al. | |
| 2020/0111834 A1* | 4/2020 | Tsai | G06K 9/0004 |

OTHER PUBLICATIONS

Taiwanese Office Action (with attached English translation) for Application No. 108113044; dated Nov. 20, 2019; 11 total pages.

\* cited by examiner

SUBSTRATE DEFORMATION DETECTION AND CORRECTION

CROSS-REFERENCE TO RELATED APPLICATIONS

This application is a continuation of U.S. patent application Ser. No. 16/377,010, filed Apr. 5, 2019, which claims priority to U.S. Provisional Patent Application No. 62/668,175, "SUBSTRATE DEFORMATION DETECTION AND CORRECTION," filed May 7, 2018, incorporated herein by reference in their entirety.

BACKGROUND

Field

Embodiments of the present disclosure generally relate to process chambers used for the fabrication of substrates, and more specifically, to methods and apparatus for substrate deformation detection and correction in process chambers.

Description of the Related Art

Substrates can be received with a deformed profile or with a flat profile from a supplier. In some examples, subsequent to various processing operations, the substrate can deform or further deform, including bowing. The deformation can reduce processing precision and result in damaged substrates. Incoming substrates can be processed to reduce or remove this bowing. However, these processes often result in overcorrecting or under-correcting the deformation, thereby not adequately addressing the bowing issue.

Thus, there is a need to be able to detect and correct incoming substrate deformation.

SUMMARY

The present disclosure generally relates to detecting and correcting incoming substrate deformation. In one example, a method for substrate processing includes: generating a plasma in a first process chamber while a substrate is positioned therein; and generating a fingerprint of the substrate based on a plurality of sensors in the first process chamber. The method can further include comparing the fingerprint to a plurality of stored fingerprint models to determine if the substrate is deformed; and selecting, based on a determination that the substrate is deformed, a substrate processing program for the substrate to correct the substrate deformation. In another example, a method for substrate processing includes: generating a fingerprint of a substrate positioned in first process chamber; comparing the fingerprint to a plurality of stored fingerprint models, wherein each fingerprint model is associated with a compressive bow or a tensile bow; and selecting, based on the comparing, a substrate processing program for the substrate.

In another examples, computer-readable storage medium is configured to execute instructions to cause a system to: generate a plasma in a first process chamber, a substrate being positioned in the first process chamber; and generate a fingerprint of the substrate based on a plurality of sensors in the first process chamber, the plurality of sensors being configured to detect a low-frequency or a high-frequency reflected power. The system can be further configured to compare the fingerprint to a plurality of stored fingerprint models to determine if the substrate is deformed; and select, based on a determination that the substrate is deformed, a substrate processing program for the substrate to correct substrate deformation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

DETAILED DESCRIPTION

The present disclosure is directed towards detecting and correcting incoming substrate deformation (bowing). Substrates used for the fabrication of electronics, including semiconductor and solid-state memory devices, undergo a plurality of processing operations. Substrates received from a substrate fabrication vendor or from an internal vendor or upstream operation can be received as flat. However, in some examples, the substrates can be deformed during upstream operations, leading to poor quality devices and/or scrapping of substrates in downstream operations including inspection. This deformation, including bowing, can lead to damage or scrapping due to challenges seating the bowed substrates on substrate support pedestals. If substrates are not properly seated on the pedestals, subsequent processing of the substrate, including material deposition and patterning, can be challenging. This can be especially true in atomic layer deposition (ALD), chemical vapor deposition (CVD), and physical vapor deposition (PVD) systems, as well as other systems designed to form thin metallic, dielectric, or combination layers, including those using plasma.

For example, if a substrate is positioned on a substrate support pedestal (or other support) such that the substrate is not flat against the supporting surface, backside defects can occur that can cause reduced substrate quality and which can negatively impact further processing operations. For example, contamination can form on the bottom of the substrate if there is a gap or gaps between the substrate and the substrate support. This contamination can spread among and between chambers of a fabrication system as the substrate is moved between chambers. Incoming substrate bow can be corrected; however, substrates with different types and degrees of bowing can respond differently to the corrective measures. Conventional processing methods apply a single correction scheme to all incoming substrates, regardless of the existence, type, or degree of defect. The degree of bowing can be measured in units of height such as microns or nanometers. The degree of bowing can be positive or negative depending upon the type of bow.

Figure 1A:
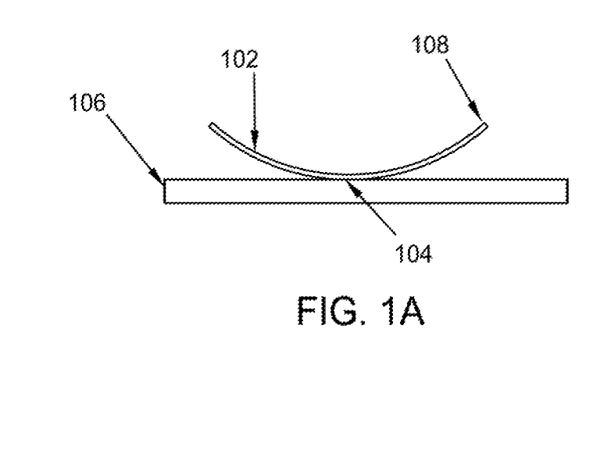
FIGS. 1A and 1B illustrate substrate deformation detectable according to embodiments of the present disclosure.
Figure 1B:
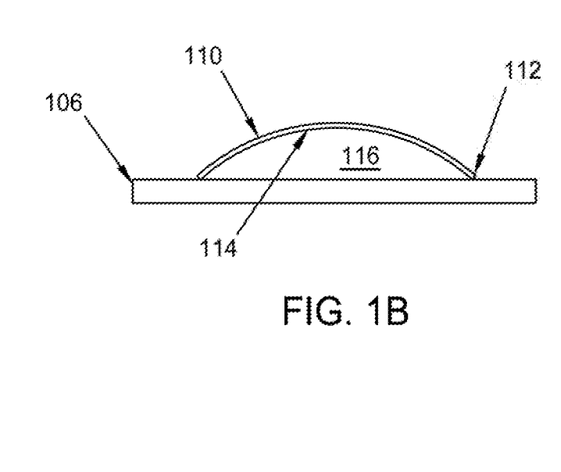

FIGS. 1A and 1B illustrate substrate deformation detectable by the systems and methods discussed herein. As shown in FIGS. 1A and 1B, the substrate deformation can take the shape of bowing, either compressive bowing as shown in FIG. 1A or tensile bowing as shown in FIG. 1B. In the compressive bowing in FIG. 1A, a bottom center surface 104 of the substrate 102 is in contact with a substrate support pedestal 106 of a chamber. However, edges 108 of the substrate 102 are directed up, away from, and not in contact with the substrate support pedestal 106. This can make transfer and handling of the substrate 102 challenging and can cause problems during thin film deposition. Conversely, the tensile bowing shown in FIG. 1B results in a bottom center surface 114 of the substrate 110 that is not in contact with the substrate support pedestal 106. Rather, the edges 112 of the substrate 110 are in contact with the substrate support pedestal 106. Additionally, a cavity 116 is formed underneath the bottom center surface 114 of the substrate 110 due to the substrate bowing.

The systems and methods discussed herein may employ a first process chamber optionally coupled to a second process chamber and/or additional process chambers. The process chambers have a substrate support pedestal capable of having a voltage applied thereto, and are configured to generate a plasma therein. An amount of power used to generate plasma in the first process chamber is monitored as discussed below. This power monitoring is used to determine the existence, type, and degree of substrate bow. This determination is made by comparing a graph of the power used to generate plasma in the first process chamber, which can be referred to as a fingerprint, to a plurality of models based on a history of fingerprint generation and analysis for a plurality of substrates across one or more first process chambers. The models are generated from a plurality of historical data regarding substrate deformation and correction of deformation. In one example, the models are experimentally determined and saved database for later reference. The models are dynamically updated as additional substrates are processed using the systems and methods discussed herein. Fingerprints for each of compressive and tensile bowing are associated with different characteristics which contribute to the characterization of fingerprints based on the models. The models are directed at least towards compressive and tensile bowing types, and can, in some examples, some or all models can be further directed to a degree of bowing within each type. Each model can be associated, e.g., linked, to at least one substrate processing program that is configured to correct a bow. Based on the comparison, a substrate processing program is selected and executed to correct or alleviate the substrate bow. In such an example, the substrate undergoes processing, such as a deposition or etch process, while bowing is reduced. Such processing improves processing uniformity.

The methods discussed herein include determining (1) when a substrate is bowed, (2) a type of substrate bow, which can be tensile or compressive, and (3) a degree of the bow. Based on one or more of these determinations, a substrate processing program is selected, and the bow can be corrected in the first process chamber where the bow is measured. The first process chamber can be coupled to a second process chamber, such as a CVD, PVD, or PE-CVD process chamber, among other chambers. A transfer chamber can be used to transfer the substrate among and between chambers. Alternatively, the substrate bow may be corrected in the second process chamber.

In one example, which can be combined with other examples, power measurements including forward and reflected power are obtained during operation of the first process chamber. The forward power is the power supplied to elements in the first process chamber (e.g., a substrate support pedestal), for example, from an RF power source. Reflected power is the power that is lost during plasma maintenance, including those losses due to resistive and capacitive losses, among others. Thus, the difference between the forward and reflected power is the power delivered to a load. The reflected power readings, which may be for low or high frequency power as discussed herein, are employed to generate fingerprints, which are used to generate models. These models are associated with substrate processing programs that facilitate bow correction. The differences in the fingerprints generated between compressive bowing and tensile bowing are used to generate models. The models indicate which substrate processing program is to be selected to correct the identified bow of the substrate.

In the methods discussed herein, each substrate positioned in the first process chamber is monitored for reflected power. The fingerprint created by the monitoring of the reflection of power by each substrate is compared to the models to determine the presence, type, and in some examples an extent of bowing in order to select a substrate processing program (e.g., model) to correct the bow, since the models are associated to substrate processing programs. In some embodiments, the substrate processing program is executed in the first process chamber to correct the bow, which can save processing costs since the transfer (robotic handling) of at least compressively bowed substrates from a first process chamber into the second process chamber can result in damaged substrates. In alternate embodiments, the substrate processing program is executed in the process chamber to correct the bow, instead of in the first process chamber.

Each substrate processing program is associated with one or more variables. The variables can include: an electrostatic voltage applied to a substrate support pedestal, a power level and frequency used to form a plasma, a gas mixture, a gas flow rate for each gas or combination of gases in the gas mixture, a pressure, a time or a plurality of times associated with the application of voltage, and other parameters, as appropriate. The types of process parameters and ranges of process parameters associated with each substrate processing program can be experimentally determined using data from previously processed substrates. Such data may be stored in a database, in which illustrative or example fingerprints are associated with process programs. These types and ranges of process parameters can be dynamically updated using data from substrates processed for substrate deformation according to examples herein. The substrates discussed herein described as incoming substrates may have one or more layers formed thereon. The layers can include silicon formed by tetraethyl orthosilicate (TEOS) and oxide layers thereof, as well as nitride layers such silicon nitride, or stacks of alternating oxide-nitride layers.

Figure 2:
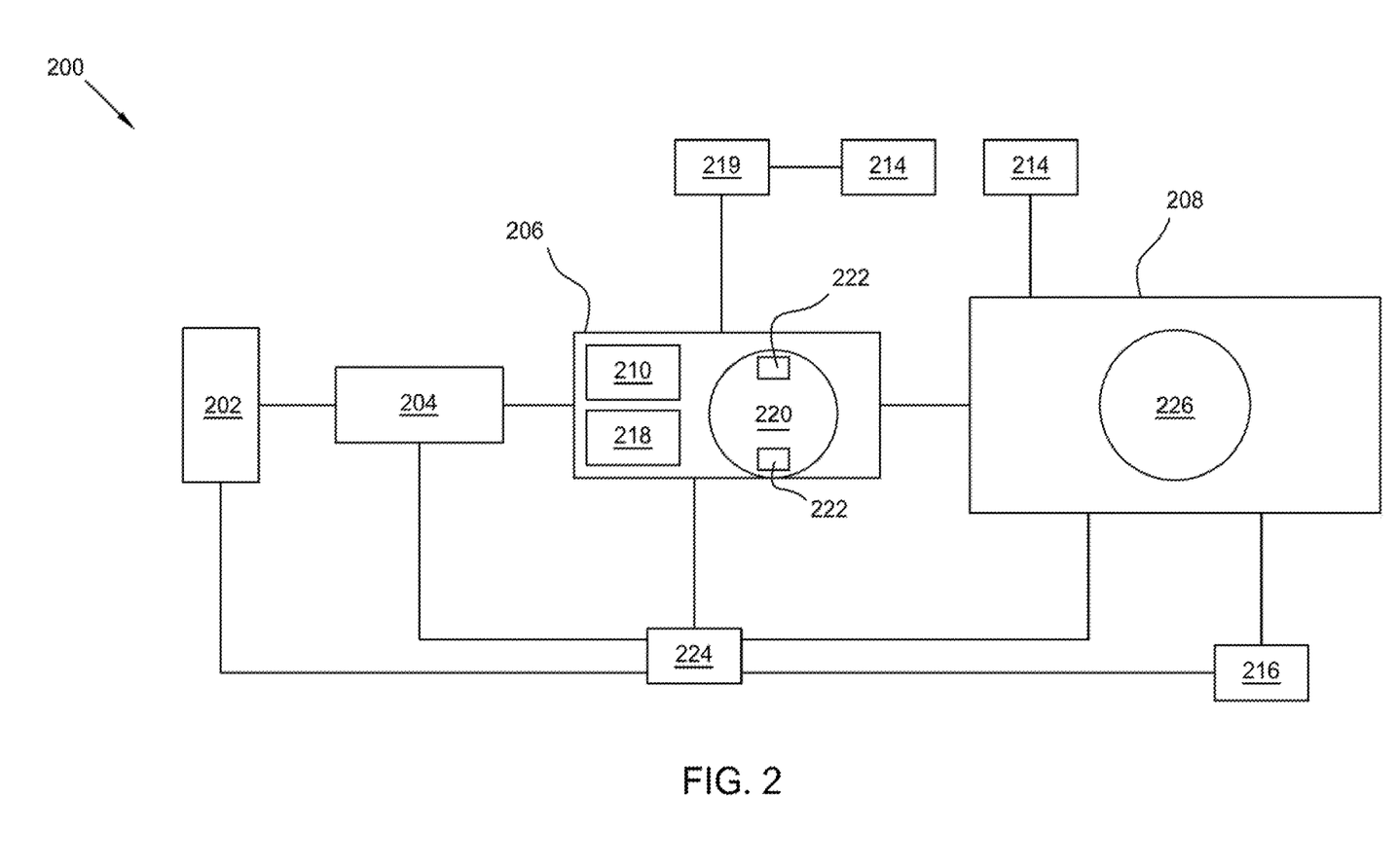
FIG. 2 is a partial schematic illustration of a system for detecting and correcting incoming substrate deformation, according to embodiments of the present disclosure.

FIG. 2 is a partial schematic illustration of a system 200 for detecting and correcting incoming substrate deformation. The system 200 includes a first process chamber 206 and an optional second process chamber 208. The first process chamber 206 and the second process chamber 208 can be used for forming and sustaining plasma and for depositing thin film metallic, dielectric, and composite layers on a substrate and/or to pattern a substrate. In one example, the system 200 includes a substrate staging apparatus 202, for example a front end for receiving substrate cassettes, and a substrate transfer apparatus 204 coupled to the substrate staging apparatus 202. The substrate transfer apparatus 204 is configured to move substrates either one by one or in batches into the first process chamber 206. The first process chamber 206 includes a plurality of sensors 210 coupled to one or more impedance-matching circuits 219 (the combination of which may be referred to as an "automatch"). The plurality of sensors 210 can be configured to detect a low-frequency or a high-frequency reflected power when plasma is generated in the first process chamber 206. The second process chamber 208 may be similarly equipped.

The first process chamber 206 is configured to receive substrates from the substrate transfer apparatus 204. In an embodiment, substrates received from the substrate transfer apparatus 204 have been through previous operations. The previous operations can include deposition processes to form one or more layers on a substrate surface, including layers of $Si_xO_y$ and $Si_xN_y$. In some examples, the one or more layers may have been patterned in previous operations. The incoming substrates received by the first process chamber 206 can include layers deposited to a thickness from 0.1 microns to 10 microns, or other thicknesses. Methods discussed herein alleviate the bow on such substrates without negatively impacting the structure and function of layers or stacks of layers on the substrate.

In an embodiment, which can be combined with other embodiments, the first process chamber 206 is configured to do one or more of heat a substrate, to detect the presence and type of bowing in a substrate, and may, in some configurations, be configured to form or remove a layer on the substrate. In one example, the first process chamber 206 is configured to generate capacitively-coupled plasma therein. In this example, the first process chamber 206 includes one or more electrodes 222 (two are shown), a gas manifold 218, and a plurality of thermocouples positioned in the walls or in a substrate support 220 of the first process chamber 206. The electrodes 222 can be wholly or partially embedded within the substrate support 220, or coupled to the substrate support 220, or both. The gas manifold 218 facilitates distribution of plurality of ionizable gases into the first process chamber 206. Such gases include argon (Ar), helium (He), krypton (Kr), xenon (Xe), or other gases or combinations of gases that can form plasma.

One or more RF power generating apparatuses 214 are coupled to the first process chamber 206 and to the second process chamber 208 and are configured to apply power to generate plasma in the chambers 206 and 208. While two RF power generating apparatuses 214 are illustrated, it is contemplated that each of the first process chamber 206 and the second process chamber 208 may share an RF power generating apparatuses 214. The one or more RF power generating apparatuses 214 facilitate formation of plasma within the first process chamber 206 and/or the second process chamber 208 when one or more gases such as argon (Ar), helium (He), krypton (Kr), or xenon (Xe) are present in the first process chamber 206 and/or the second process chamber 208.

A controller 224 is coupled to the substrate staging apparatus 202, the substrate transfer apparatus 204, the first process chamber 206, and the second process chamber 208. A plurality of substrate processing programs is stored in a non-transitory memory 216 and is accessible by the controller 224, which is configured to execute the plurality of substrate processing programs. Each substrate processing program is configured to adjust one or more characteristics of conditions within the first process chamber 206 or the second process chamber 208 to alleviate substrate bow. The controller 224 can be configured to execute instructions associated with one or more applications/programs of the system 200.

The plurality of sensors 210 coupled to or disposed in the first process chamber 206 are employed to determine if incoming substrates have a bow. The plurality of sensors 210 are further used to determine, if a bow is present, if the bow is compressive or tensile, as discussed below. Subsequently, based on the presence and the type of bow of the incoming substrate, a plurality of logic (non-transitory computer-readable medium) stored in the non-transitory memory 216 is executed to select a substrate processing program to correct the determined bow. Each substrate processing program can be associated with substrate processing, e.g., film formation, patterning, cleaning, etc., in either or both of the first process chamber 206 or the second process chamber 208. The stored substrate processing programs are each associated with a type of bowing (compressive or tensile). In some examples, at least some substrate processing programs can be further associated with a degree of bowing. The degree of bowing can be defined as positive or negative, and/or as a numerical value or range of values.

In one example, a substrate processing program is selected based upon one or more of the type or the degree of bowing detected by the sensors 210. The selected program is executed by the controller 224 to process the substrate to alleviate the bow via a voltage applied to the substrate support 220 (e.g., an electrostatic chuck thereof) of the first process chamber 206 and/or the substrate support pedestal 226 of the second process chamber 208. For example, a predetermined amount voltage may be applied to an electrostatic chuck upon which the substrate is positioned. Application of a predetermined voltage, in accordance with the selected program, reduces or eliminates the bow of the substrate without application of excessive stress which could otherwise occur when a tailored program selection is not employed. Other processing parameters, besides voltage, may also be employed to correct substrate bow. In addition, the processing program can also direct the formation of plasma in the first process chamber 206 or the second process chamber 208.

Figure 3:
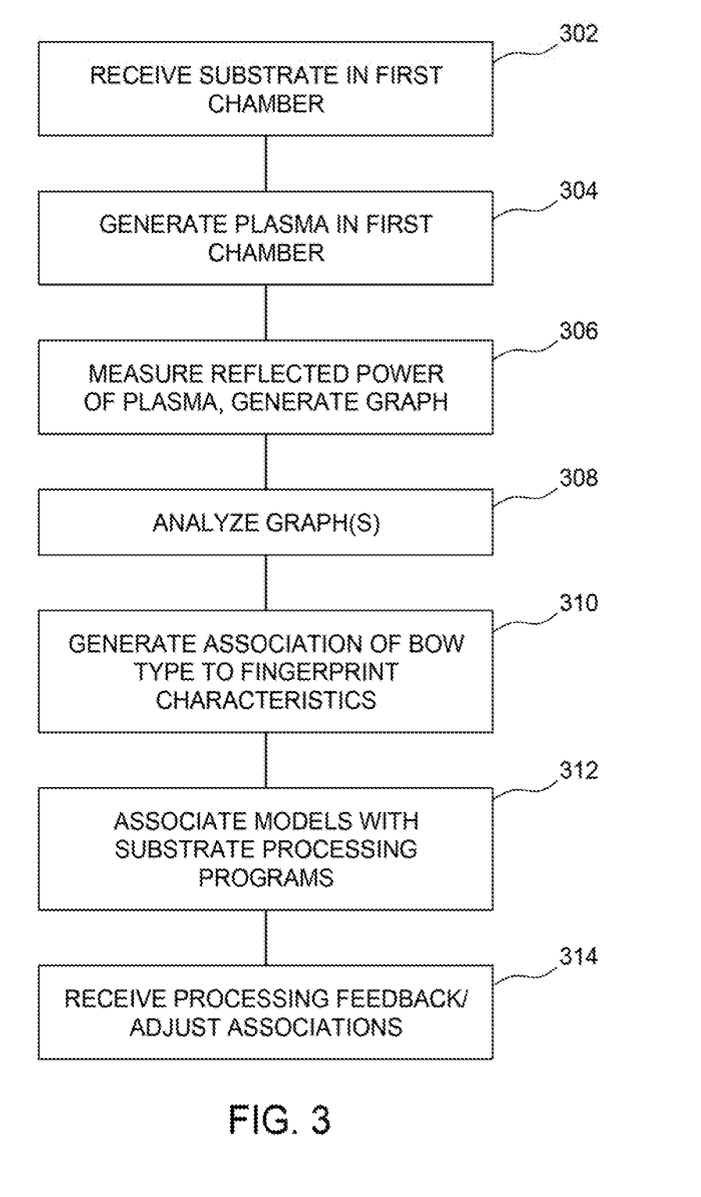
FIG. 3 is a method of analyzing a plurality of low-frequency (LF) refraction and categorizing a plurality of LF refraction in a first process chamber, according to embodiments of the present disclosure.

FIG. 3 is a method 300 of analyzing a plurality of low-frequency (LF) reflection and categorizing a plurality of LF reflection in a first process chamber. The low frequency power discussed herein refers to power below about 500 kHz, and the high frequency power discussed herein is at or above about 13.56 MHz. In the method 300, at operation 302, one or more substrates is loaded one by one into the first process chamber. Optionally, the first process chamber is configured to control the one or more substrates within a temperature within a range of 200° C. to 500° C. while maintaining a vacuum therein. The optional heating facilitates one or more of processing of the substrate, mimicking of process conditions under which a substrate is processed, and reduction in substrate bow. At operation 304, subsequent to the substrate receipt at operation 302, capacitive plasma is generated in the first process chamber. In one example, the plasma is generated at operation 304 by applying a current of about 500 kHz to the first process chamber while flowing argon (Ar), helium (He), krypton (Kr), or xenon (Xe) or another gas, at a pressure from about 1 Torr to about 20 Torr.

In operation 306, an amount of reflected power of the plasma generated is measured. A graph is generated to create a fingerprint of the corresponding substrate being processed. The graph generated can be referred to as a fingerprint because the graph is associated with the unique reaction of a substrate to plasma in the chamber based on the deformation type and degree of the substrate. In one example, the fingerprint is a graph of reflected power percentage (of total output power) versus time. Other fingerprints, including heating temperature or heater output percentage, versus time, are also contemplated and can be used alone or in combination with a graph of the reflected power percentage according to various examples and combinations of examples herein. Reflected power is measured using an automatch sensor, other sensor, or impedance matching hardware equipped for such measurements.

In operation 308, the graph, e.g., fingerprint, generated at operation 306 is analyzed. The analysis is used to determine a plurality of characteristics of the fingerprint that indicate that the bow is (1) present and (2) whether the bow compressive or tensile. This analysis is used at operation 310 to generate an association between either a compressive or a tensile designation and a plurality of fingerprint characteristics and combinations of characteristics. The analysis at operation 308 is used in operation 310 to generate associations between the bow characteristics of the substrate and the fingerprint characteristics. In one example, the operation 310 is a modeling operation. Each model is associated with a type of bowing, compressive or tensile, and, in some embodiments, further associated with a degree of bowing. Stated otherwise, operation 310 corresponds the bow of a substrate with a particular fingerprint. Thus, the bows of later-processed substrates can be identified based on a respective fingerprint of the later-processed substrates.

At operation 312, the associations generated at operation 310 between the bow characteristics of the substrate and the fingerprint characteristics are linked to substrate processing programs. Such as associations may be determined experimentally. These linked associations are stored for later reference. The substrate processing programs and associations are stored, for example, in the non-transitory memory. The association of models to substrate processing programs facilitates the correction of substrate bow. For example, each substrate processing program may include a process recipe for correcting a specific type and degree of bow (as well as other processing details), based on a recognized model or fingerprint. Thus, as substrate models and/or fingerprints are identified, the bow of a substrate can be identified and can be alleviated via execution of a corresponding substrate processing program.

At operation 314 of the method 300, a plurality of inspection parameters are received from downstream operations, including coating uniformity data or substrate damage/scrap data. The information is received at operation 314 and stored in memory. In an embodiment, which can be combined with other embodiments, information from downstream operations received at operation 314 can be employed to modify the associations generated at operation 310 and/or the processing programs, in order to improve processing. In other examples, which can be combined with other examples herein, information from downstream operations received at operation 314 can be employed to modify the associations of bow types and/or bow extents and substrate processing generated at operation 312. Thus, the degree and extent of bow correction can be continuously refined to improve process performance.

Each substrate processing program of the plurality of substrate processing programs discussed herein includes a process recipe or instructions for a voltage to be supplied to the substrate support pedestal or other substrate support. The selected processing program may also include other parameters, such as a gas or gas mixture composition, gas flow rates rate, processing time, temperature, and a pressure of a process chamber, in order to facilitate processing of a substrate while undergoing bow correction. In some examples, the substrate processing programs further include parameters associated with the transfer of substrates from the first process chamber into the second process chamber.

Figure 4:
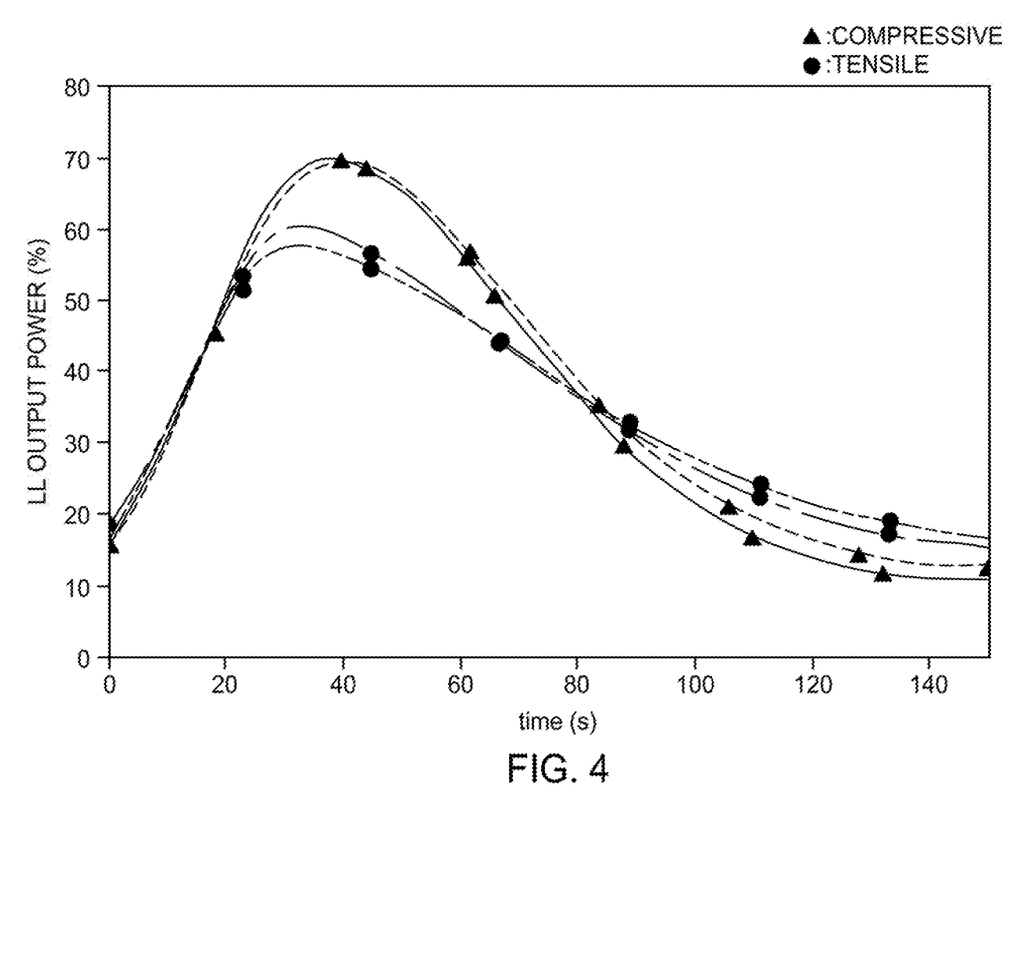
FIG. 4 is a graph of the first process chamber output power percentage over time for a plurality of substrates with both tensile and compressive bows, according to embodiments of the present disclosure.

FIG. 4 is a graph of the first process chamber output power percentage over time for a plurality of substrates with both tensile and compressive bows. FIG. 4 shows a plurality of substrate data for both compressive and tensile bows. The characteristics of the curves are analyzed as discussed herein to generate a fingerprint associated with compressive bows and a fingerprint associated with tensile bows. The curves' characteristics can be associated with a type and degree of bowing. Each fingerprint as shown in FIG. 4 is generated by the method 300 and analyzed at operation 308 for a plurality of characteristics including an area under the curve, slope measured over various time periods, peak, change in slope, and other characteristics. Such analyzation facilitates determination, and correction, of substrate bow.

Figure 5:
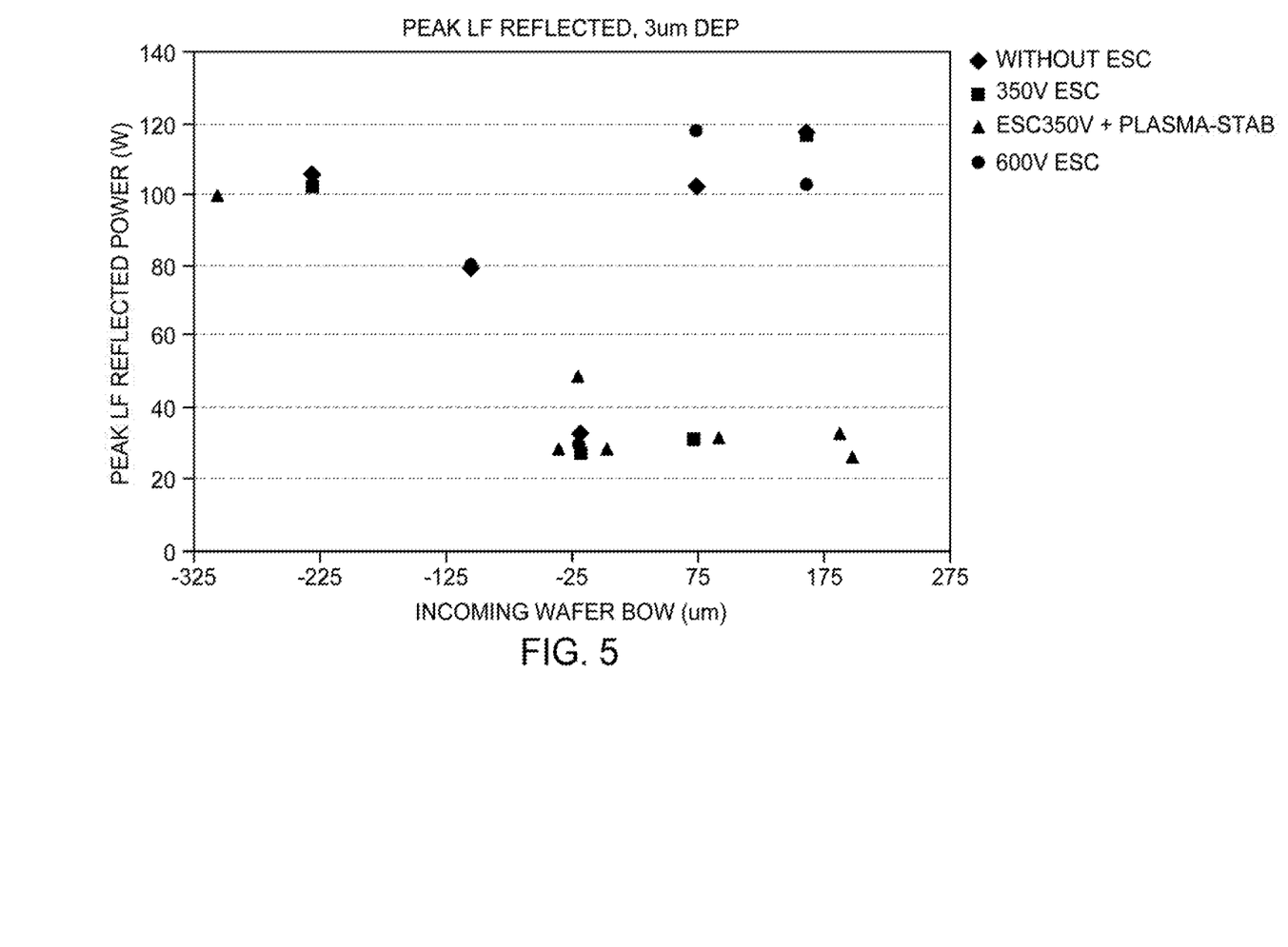
FIG. 5 is a graph of a peak low-frequency power reflected for a plurality of substrates, according to embodiments of the present disclosure.

FIG. 5 is a graph of a peak low-frequency power reflected for a plurality of substrates with about a 3 micron film deposited on a surface of the substrate. The peak power axis of FIG. 5 shows how much power is reflected from the plasma in the first process chamber. The more power that is lost during plasma maintenance, the more severe the substrate bowing. The incoming substrate bow of FIG. 5 is a bowing of the substrates (1) with no voltage applied to the substrate support pedestal in the process chamber ("without ESC"), (2) with either 350 volts or 600 volts applied to an electrostatic chuck of the substrate support pedestal, and (3) with 350 volts applied to the electrostatic chuck of the substrate support pedestal and with a plasma stabilized in the process chamber.

In various examples, a substrate bow detected using the methods and systems herein may be from −200 microns to +290 microns or greater. A plurality of impedance-matching circuits (219 in FIG. 2), and the plurality of sensors 210 associated therewith, are coupled to the first process chamber to facilitate determination of the output (forward) power and the peak low-frequency reflected power, as shown respectively in FIGS. 4 and 5.

Figure 6:
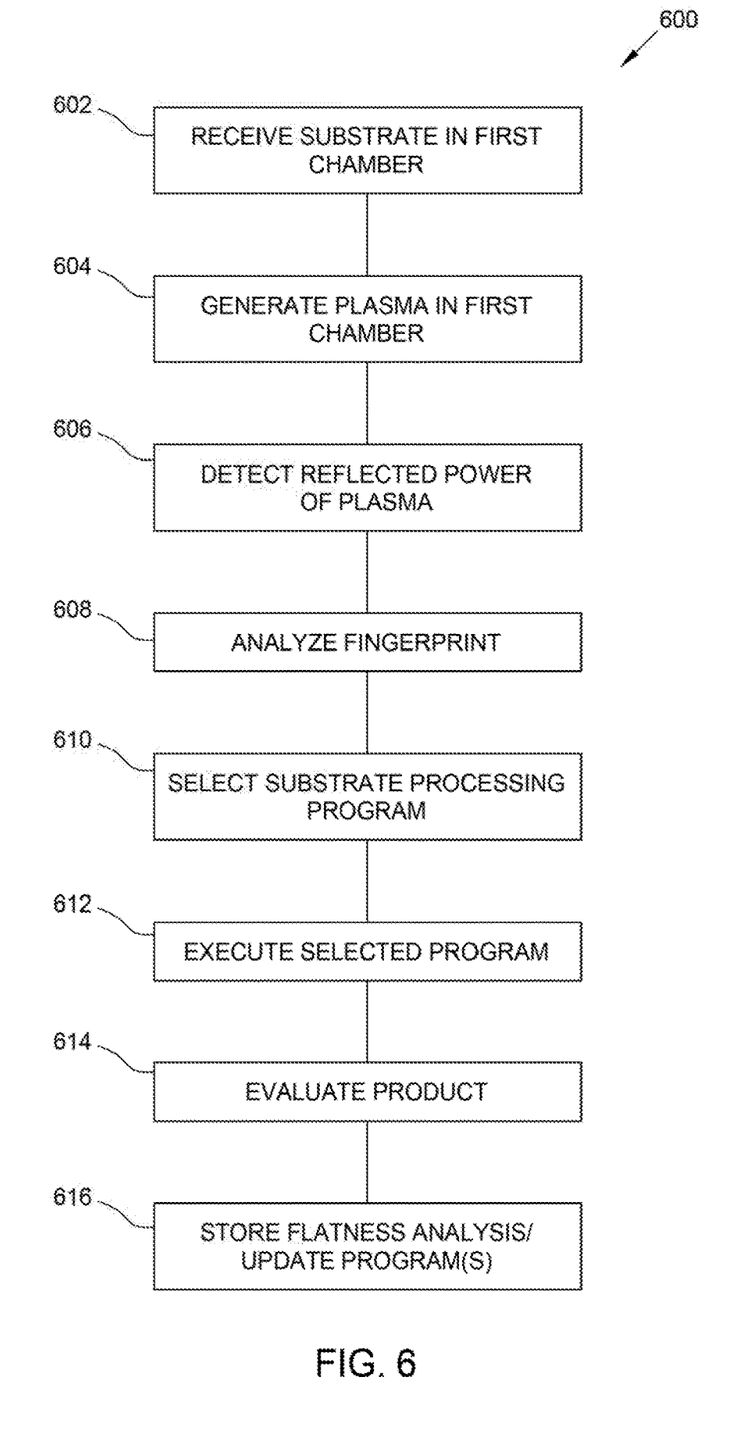
FIG. 6 is a method of detecting incoming substrate deformation according to embodiments of the present disclosure.

FIG. 6 is a method 600 of detecting incoming substrate deformation according to embodiments of the present disclosure. At operation 602 of the method 600, a substrate is received in a first process chamber that may be similarly configured to the first process chamber 206 in FIG. 2. The substrate received at operation 602 can have one or more layers formed thereon. The one or more layers can include a silicon oxide layer ($Si_xO_y$), a nickel oxide ($Ni_xO_y$), silicon nitride ($Si_xN_y$), an oxynitride layer, or a stack of alternating oxide-nitride layers, among other examples. The first process chamber (e.g., 206 in FIG. 2) can be heated to a temperature of 200° C. to 500° C. when the substrate is positioned therein. At operation 604, subsequent to the substrate receipt at operation 602, capacitive plasma is generated in the first process chamber 206.

During the operation of the first process chamber 206, at operation 606, a plurality of sensors detects reflected power, and the reflected power is graphed to generate a fingerprint, such as that shown in FIG. 5. The fingerprint is analyzed at operation 608. This analysis includes a comparison of a plurality of characteristics of the fingerprint to one or more established fingerprint models (for example, those established with respect to FIG. 3). Based on the analysis at operation 608, a substrate processing program is selected at operation 610. The program selected at operation 610 is executed in the first process chamber 206 at operation 612. The selected program results in processing of the substrate (such as deposition, etching, or the like) while chucking the substrate to remove bow. The selected program is chosen such that substrate bow is minimized or eliminated during the processing, but the substrate is not over chucked to the point of damaging the substrate or under-chucked such unsatisfactory bow remains.

At operation 614, a plurality of attributes of the processed substrate can be evaluated after the execution of the selected substrate processing program at operation 612. In some examples, operation 614 can alternately or additionally occur after subsequent downstream operations such as film deposition, patterning, or cleaning operations. At operation 616, a plurality of information based on the evaluation at operation 614, including a substrate flatness analysis, can be stored for further use and analysis, and/or used to update existing fingerprint models, processing programs, or other information.

In one example, subsequent to selecting the substrate processing program at operation 610, the substrate is transferred to a second process chamber. In such an example, operation 612 may occur in the second process chamber. The second process chamber can be similar to the second process chamber 208 in FIG. 2.

In an additional example, when a compressive substrate is detected as discussed in the method 600 in FIG. 6, a plurality of transfer operation parameters may be employed. Due to the bowed nature of the substrate, the substrate may not be stable during transfer, due to rocking or shifting that may occur due to the substrate's bowed bottom. The transfer operation parameters are selected to reduce rocking or shifting of the substrate. The transfer operation parameters can include transfer speed of a transfer robot's arm or arms, gripping pressure, and/or gripping position.

In one example, a first substrate with a compressive bow is analyzed and associated with a first substrate processing program. The first substrate processing program corresponds to a first processing recipe with a first voltage, first duration, first pressure, and a first gas or gas mixture composition, and first temperature to facilitate bow alleviation. In one example, the first substrate processing program includes heating the substrate to 200° C. to 500° C. The first voltage is from 500 V to 1000 V, and can be applied for 5 seconds to 3 minutes. The first voltage can be applied at a pressure from 1 Torr to 20 Torr in plasma formed from He and Ar. In another example, a second substrate with a tensile bow is associated with a substrate processing program. The second substrate processing program corresponds to a second process recipe with a second voltage, second duration, second pressure, and a second gas or gas mixture to be used while heating the substrate to facilitate bow alleviation. The second substrate processing program instructs the process chamber to heat the substrate to a temperature of 200° C. to 500° C. A second voltage of 150 V to 500 V is applied to the substrate support for 5 seconds 3 minutes. The second voltage can be applied at a chamber pressure from 1 Torr to 20 Torr, without generating plasma inside of the process chamber, to correct substrate bow.

Accordingly, using the systems and methods discussed herein, incoming substrates can be analyzed to detect the presence, type, and degree of bowing of a substrate. Once bowing is detected, a substrate processing program can be selected based on the type and degree of bowing and executed to alleviate the bow. Detecting and correcting a bowed substrate based on the type and extent of bowing, in contrast to conventional methods that apply the same correction method to some or all substrates regardless of the substrate condition, increases the quality of layers formed and/or patterned downstream, decreasing scrap and increasing device quality.

To facilitate understanding, identical reference numerals have been used, where possible, to designate identical elements that are common to the figures. It is contemplated that elements and features of one embodiment may be beneficially incorporated in other embodiments without further recitation.

While the foregoing is directed to embodiments of the present disclosure, other and further embodiments of the disclosure may be devised without departing from the basic scope thereof, and the scope thereof is determined by the claims that follow.

What is claimed is:

1. A method for substrate processing, comprising:
generating a plasma in a first process chamber while a substrate is positioned therein;
generating a fingerprint comprising reflected power of the plasma of the substrate based on a plurality of sensors in the first process chamber;
comparing the fingerprint to a plurality of stored fingerprint models to determine if the substrate is deformed;
determining, based on the comparison of the fingerprint to the plurality of stored fingerprint models, that the substrate is deformed; and
selecting, based on the determination that the substrate is deformed, a substrate processing program for chucking the substrate to correct the substrate deformation.

2. The method of claim 1, further comprising:
executing the selected substrate processing program in the first process chamber; and
correcting, in response to executing the selected substrate processing program, the substrate deformation.

3. The method of claim 2, further comprising:
subsequent to correcting the substrate deformation, transferring the substrate to a second process chamber, the second process chamber being coupled to the first process chamber via a transfer chamber; and
performing a second operation in the second process chamber.

4. The method of claim 1, further comprising:
transferring the substrate to a second process chamber;
executing the selected substrate processing program in the second process chamber; and
correcting, in response to executing the selected substrate processing program, the substrate deformation.

5. The method of claim 1, wherein the plurality of sensors is configured to detect a low-frequency or a high-frequency reflected power.

6. The method of claim 1, wherein the substrate deformation is one of a compressive bow or a tensile bow.

7. The method of claim 1, wherein each fingerprint model is associated with a compressive bow or a tensile bow.

8. The method of claim 1, wherein the plasma is generated from one or more of argon (Ar), helium (He), krypton (Kr), or xenon (Xe).

9. A method for substrate processing, comprising:
generating a plasma in a first process chamber;
generating a fingerprint of a substrate positioned in the first process chamber, the fingerprint comprising reflected power of the plasma;
comparing the fingerprint to a plurality of stored fingerprint models, wherein each fingerprint model is associated with a type of deformation of the substrate;
determining, based on the comparison of the fingerprint to the plurality of stored fingerprint models, that the substrate is deformed; and
selecting a substrate processing program for the substrate to correct a substrate deformation.

10. The method of claim 9, further comprising the fingerprint being generated based on a plurality of sensors in the first process chamber configured to detect a low-frequency or a high-frequency reflected power to determine the substrate deformation.

11. The method of claim 10, further comprising:
executing the selected substrate processing program in the first process chamber; and
correcting, in response to executing the selected substrate processing program, the substrate deformation.

12. The method of claim 11, further comprising:
subsequent to correcting the substrate deformation, performing a second operation in the second process chamber.

13. The method of claim 12, wherein the second operation comprises deposition, etching, or cleaning.

14. The method of claim 9, further comprising:
transferring the substrate to a second process chamber;
disposing the substrate on a substrate support in the second process chamber;
executing the selected substrate processing program in the second process chamber; and
correcting, in response to executing the selected substrate processing program, the substrate deformation.

15. A computer-readable storage medium configured to execute instructions to cause a system to:
generate a plasma in a first process chamber, a substrate being positioned in the first process chamber;
generate a fingerprint of the substrate comprising reflected power of the plasma, based on a plurality of sensors in the first process chamber, the plurality of sensors being configured to detect a low-frequency or a high-frequency reflected power;
compare the fingerprint to a plurality of stored fingerprint models to determine if the substrate is deformed;
determine, based on the comparison of the fingerprint to the plurality of stored fingerprint models, that the substrate is deformed; and
select, based on the determination that the substrate is deformed, a substrate processing program for the substrate to correct substrate deformation.

16. The computer-readable storage medium of claim 15, further comprising the system being configured to:
execute the selected substrate processing program in the first process chamber; and
correct, in response to executing the selected substrate processing program, the substrate deformation.

17. The computer-readable storage medium of claim 15, further comprising the system being configured to:
transfer the substrate to a second process chamber;
position the substrate on a substrate support in the second process chamber;
execute the selected substrate processing program in the second process chamber; and
correct, in response to executing the selected substrate processing program, the substrate deformation.

18. The computer-readable storage medium of claim 15, wherein the substrate deformation is one of a compressive bow or a tensile bow.

19. The computer-readable storage medium of claim 15, wherein each fingerprint model is associated with a compressive bow or a tensile bow.

20. The computer-readable storage medium of claim 15, wherein the plasma is generated from one or more of argon (Ar), helium (He), krypton (Kr), or xenon (Xe).

* * * * *